(12) United States Patent
Sargent

(10) Patent No.: US 6,888,666 B1
(45) Date of Patent: May 3, 2005

(54) DYNAMICALLY RECONFIGURABLE OPTICAL AMPLIFICATION ELEMENT

(75) Inventor: Edward H. Sargent, Toronto (CA)

(73) Assignee: Dakota Investment Group, Inc., West Chester, PA (US)

( * ) Notice: Subject to any disclaimer, the term of this patent is extended or adjusted under 35 U.S.C. 154(b) by 181 days.

(21) Appl. No.: 09/988,030

(22) Filed: Nov. 16, 2001

(51) Int. Cl.$^7$ ............................ G02F 1/365; H01S 5/50
(52) U.S. Cl. ........................ 359/332; 359/326; 359/344
(58) Field of Search ............................... 359/326–332, 359/333, 342, 344

(56) References Cited

U.S. PATENT DOCUMENTS

| | | |
|---|---|---|
| 4,805,179 A | 2/1989 | Harder et al. |
| 4,871,690 A | 10/1989 | Holonyak, Jr. et al. |
| 5,084,894 A * | 1/1992 | Yamamoto .................. 372/50 |
| 5,298,454 A | 3/1994 | D'Asaro et al. |
| 5,353,295 A | 10/1994 | Holonyak, Jr. et al. |
| 5,384,797 A | 1/1995 | Welch et al. ................. 372/23 |
| 5,395,793 A | 3/1995 | Charbonneau et al. |
| 5,425,043 A | 6/1995 | Holonyak, Jr. et al. |
| 5,455,429 A | 10/1995 | Paoli et al. |
| 5,539,763 A | 7/1996 | Takemi et al. |
| 5,574,745 A | 11/1996 | Paoli et al. |
| 5,608,753 A | 3/1997 | Paoli et al. |
| 5,699,375 A | 12/1997 | Paoli ............................ 372/50 |
| 5,707,890 A | 1/1998 | Emery et al. |
| 5,708,674 A | 1/1998 | Beernink et al. |
| 5,766,981 A | 6/1998 | Thornton et al. |
| 5,771,256 A | 6/1998 | Bhat |
| 5,843,802 A | 12/1998 | Beernink et al. |
| 5,882,951 A | 3/1999 | Bhat |
| 5,915,165 A | 6/1999 | Sun et al. |
| 5,959,764 A * | 9/1999 | Edagawa et al. ............ 359/326 |
| 6,005,708 A * | 12/1999 | Leclerc et al. .............. 359/326 |
| 6,027,989 A | 2/2000 | Poole et al. |
| 6,075,804 A | 6/2000 | Deppe et al. .................. 372/96 |
| 6,563,627 B2 * | 5/2003 | Yoo ............................ 359/326 |
| 6,611,007 B2 * | 8/2003 | Thompson et al. ......... 257/184 |
| 6,697,414 B1 * | 2/2004 | Kato et al. ................... 372/102 |
| 2002/0003650 A1 * | 1/2002 | Usami et al. ............... 359/248 |
| 2002/0195597 A1 * | 12/2002 | Choa ........................... 257/14 |

OTHER PUBLICATIONS

Journal of Crystal Growth (2000), "Growth of novel InP-based materials by He-plasma-assisted epitaxy," Authors: Pinkney et al.; pp. 237-241.

(Continued)

Primary Examiner—John D. Lee
(74) Attorney, Agent, or Firm—Blank Rome LLP

(57) ABSTRACT

An optical amplifier has a spatially varying absorption spectrum formed in a monolithic InGaAsP structure whose quantum well active structure has modified effective bandgap properties. The effective bandgap properties can be modified by rapid thermal annealing to cause the diffusion of defects from one or two InP defect layers into the quantum well active structure. Multiple such optical amplifiers, having their effective bandgap properties modified to provide different gain spectra, can be monolithically formed in a single semiconductor structure for broadband amplification, in which case their individual gain spectra can be controlled to control the total gain spectrum dynamically. Alternatively, the optical amplifier can be used in a Mach-Zehnder wavelength converter for broadband wavelength conversion.

21 Claims, 2 Drawing Sheets

OTHER PUBLICATIONS

J. Vac. Sci. Technol. A 16(2), Mar./Apr. 1998, "Characterization of annealed high-resistivity InP grown by He-plasma-assisted epitaxy," Authors: Pinkney et al.; pp. 772-775.

J. Vac. Sci. Technol. A 16(2), Mar./Apr. 1998, "Quantum well intermixing in material systems for 1.5 μm (invited)," Authors: Marsh et al.; pp. 810-816.

IEEE Photonics Technology Letters, vol. 8, No. 9, Sep. 1996, "10 Gb/s Wavelength Conversion with Integrated Multiquantum-Well-Based 3-Port Mach-Zehnder Interferometer," Authors: Idler et al.; pp. 1163-1165.

J. Appl. Phys. 79(2), Jan. 15, 1996, "Compositional disordering of InGa/As/GaAs heterostructures by low-temperature-grown GaAs layers," Authors: Tsang et al.; pp. 664-670.

IEEE Photonics Technology Letters, vol. 7, No. 9, Sep. 1995, "Monolithic Integration of InGaAsP-InP Stratined-Layer Distributed Feedback Laser and External Modulator by Selective Quantum-Well Interdiffusion," Authors: Ramdane et al.; pp. 1016-1018.

"Quantum Well Intermixing Caused By Non-Stoichiometric INP," Authors: Haysom et al.; pp. 56-59, 2000, IEEE, XP-002183000.

A. Ramdane et al, "Monolithic Integration of InGaAsP-InP Strained-Layer Distributed Feedback Laser and External Modulator by Selective Quantum-Well Interdiffusion," *IEEE Photonics Technology Letters*, vol. 7, No. 9, Sep., 1995, pp. 1016-1018.

* cited by examiner

DYNAMICALLY RECONFIGURABLE OPTICAL AMPLIFICATION ELEMENT

FIELD OF THE INVENTION

The present invention is directed to a dynamically reconfigurable optical amplification element and more particularly to such an element which can be implemented in a monolithic semiconductor structure.

DESCRIPTION OF RELATED ART

In reconfigurable fiber-optic networks, the average amount of power on a single strand of fiber may change in time; for example, new wavelength channels may be used as more bandwidth is needed, or in optically switched networks, signals from different points of origin, and thus of different intensities, may occupy links at different times. The gain spectrum of an optical amplifier depends to some extent on the power of signals which it is amplifying. As a result, gain in reconfigurable networks may be expected to fluctuate undesirably and unintendedly in time. To avoid the occurrence of an unacceptable number of bit errors in information transmission, it is necessary for optical amplifying elements to account for, and respond to, such fluctuations.

Another task to which amplifiers are put in optical networks is wavelength conversion. One technique for wavelength conversion is disclosed in W. Idler et al, "10 Gb/s Wavelength Conversion with Integrated Multiquantum-Well-Based 3-Port Mach-Zehnder Interferometer," *IEEE Photonics Technology Letter*, Vol. 8, No. 9, September, 1996, pp. 1163–5. In a monolithic three-port Mach-Zehnder interferometer, a first port receives an unmodulated carrier wave $\lambda_c^{(cw)}$ having a wavelength $\lambda_c$. A second port receives a modulated signal wave $\lambda_s^{(data)}$ having a wavelength $\lambda_s$. The two waves interfere in the interferometer such that a third port outputs a modulated signal $\lambda_c^{(data)}$ having the wavelength $\lambda_c$. Both static and dynamic wavelength conversion are possible.

U.S. patent application Ser. No. 09/833,078 to Thompson et al, filed Apr. 12, 2001, entitled "A method for locally modifying the effective bandgap energy in indium gallium arsenide phosphide (InGaAsP) quantum well structures," whose entire disclosure is hereby incorporated by reference into the present disclosure, teaches a method for locally modifying the effective bandgap energy of indium gallium arsenide phosphide (InGaAsP) quantum well structures. That method allows the integration of multiple optoelectronic devices within a single structure, each comprising a quantum well structure. A division of the just-cited patent application has been granted as U.S. Pat. No. 6,611,007.

In one embodiment, as shown in FIG. 1A, an InGaAsP multiple quantum well structure 104 formed on a substrate 102 is overlaid by an InP (indium phosphide) defect layer 106 having point defects 108, which are donor-like phosphorus antisites or acceptor-like indium vacancies. Rapid thermal annealing (RTA) is carried out under a flowing nitrogen ambient, using a halogen lamp rapid thermal annealing system. During the rapid thermal annealing, the point defects 108 in the defect layer 106 diffuse into the active region of the quantum well structure 104 and modify its composite structure. The controlled inter-diffusion process causes a large increase in the bandgap energy of the quantum well active region, called a wavelength blue shift.

Another embodiment, as shown in FIG. 1B, uses two defect types, one to generate a wavelength blue shift and the other to decrease carrier lifetime. A first InP defect layer 110 contains slowly diffusing vacancy defects 114, while a second InP defect layer 112 includes rapidly diffusing group V interstitial defects 116. Rapid thermal annealing causes both types of defects to diffuse into the quantum well active region.

However, a satisfactory solution to the problem of the reconfigurable optical amplifier has not yet been found.

SUMMARY OF THE INVENTION

It will be readily apparent from the above that a need exists in the art to take the above-noted fluctuation into account. It is therefore an object of the invention to provide a dynamically reconfigurable optical amplification element which can do so.

To achieve the above and other objects, a first embodiment of the present invention is directed to a dynamically reconfigurable amplification element which can re-equalize gain in response to changing needs on different channels or different fibers. Under the invention, the Thompson et al process, or any other suitable intermixing process, is used to provide a method of creating amplifying media with multiple sections, each providing optical gain centered about a different wavelength. This is difficult or impossible to do in the prior art. Each of these sections will be adjustable in its gain independently. As a result, it will be possible to reconfigure the combined amplifying spectrum according to time-varying network needs.

A second embodiment of the present invention is directed to an optical amplifier with the realization, on the same substrate, of passive (non-absorbing) waveguides, in order to form an interferometer for cross-phase modulation of one signal at one wavelength of a probe beam at a generally different wavelength. The resulting device serves as a wavelength converter over a broad spectrum.

BRIEF DESCRIPTION OF THE DRAWINGS

Two preferred embodiments of the present invention will be set forth in detail with reference to the drawings, in which.

DETAILED DESCRIPTION OF THE PREFERRED EMBODIMENT

Figure 1A:
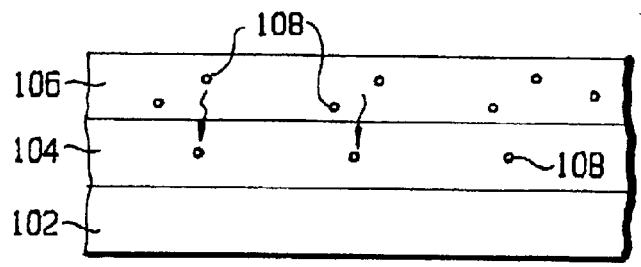
FIGS. 1A and 1B show two embodiments of the technique of the above-cited Thompson et al patent application.
Figure 1B:
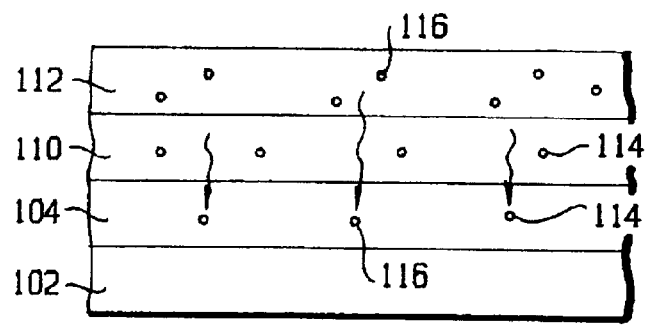

Two preferred embodiments of the present invention will be set forth in detail with reference to the drawings, in which like reference numerals refer to like elements or operational steps throughout.

Figure 2A:
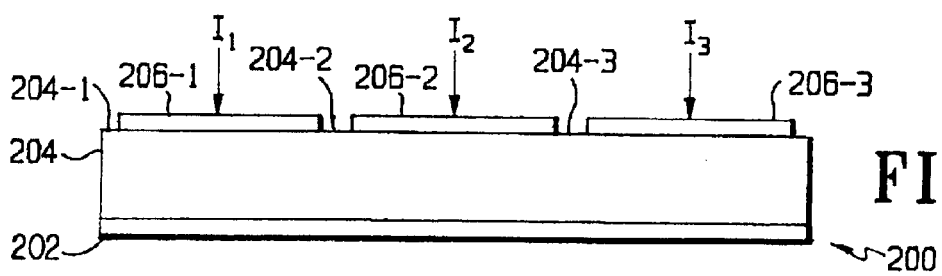
FIG. 2A shows a schematic diagram of a dynamically reconfigurable optical amplification element according to the first preferred embodiment.

As shown in FIG. 2A, an amplification element 200 includes a substrate 202 on which a quantum well structure 204 is formed. The quantum well structure is formed as three (or another suitable number) sections 204-1, 204-2, 204-3. each having a gain spectrum controllable by the application of a current $I_1$, $I_2$ or $I_3$ to an electrode 206-1, 206-2 or 206-3. The sections 204-1, 204-2, 204-3 are formed as separate quantum well active regions, but are formed in a single quantum well structure 204 to provide a monolithic structure.

Figure 2B:
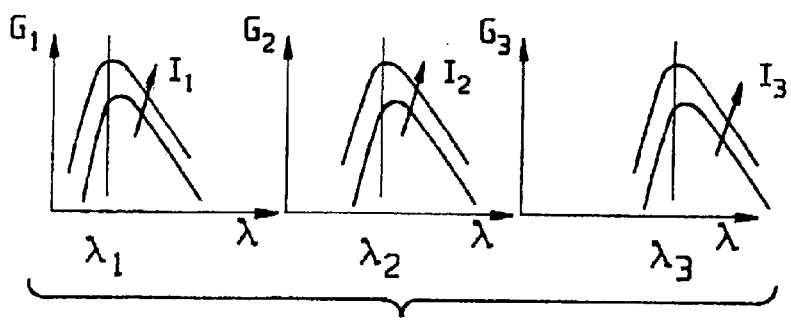
FIG. 2B shows plots of the gain spectra of the three individual sections of the element of FIG. 2A.

FIG. 2B shows the manner in which each current $I_1$, $I_2$ or $I_3$ controls a corresponding gain spectrum $G_1$, $G_2$ or $G_3$. As shown, in each of the sections 204-1, 204-2, 204-3, the gain spectrum $G_1$, $G_2$ or $G_3$ is shifted both upward and in the direction of lower wavelength $\lambda$, so as to have a new maximum $\lambda_1$, $\lambda_2$ or $\lambda_3$. The sections have different gain spectra by virtue of their different compositions, their different thicknesses, a combination of the two, or any other suitable differing characteristics.

Figure 2C:
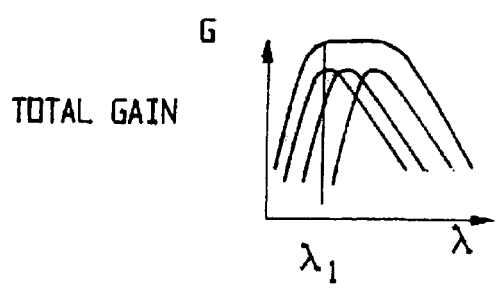
FIG. 2C shows a plot of the total gain spectrum of the element of FIG. 2A.

FIG. 2C shows the total gain $G_{tot}$ as the sum of the gain spectra of FIG. 2B. Of course, since each of the three gain spectra $G_1$, $G_2$ or $G_3$ is separately controllable through separate control of the corresponding current $I_1$, $I_2$ or $I_3$, the currents could be selected to provide any of a wide variety of other gain spectra. Thus, a communication system including the amplification element 200 can be reconfigured on the fly to meet the changing needs of the network.

The sections 204-1, 204-2 and 204-3 can be made by any of the techniques disclosed in the above-cited Thompson et al patent application or by any other suitable intermixing techniques.

Figure 3:
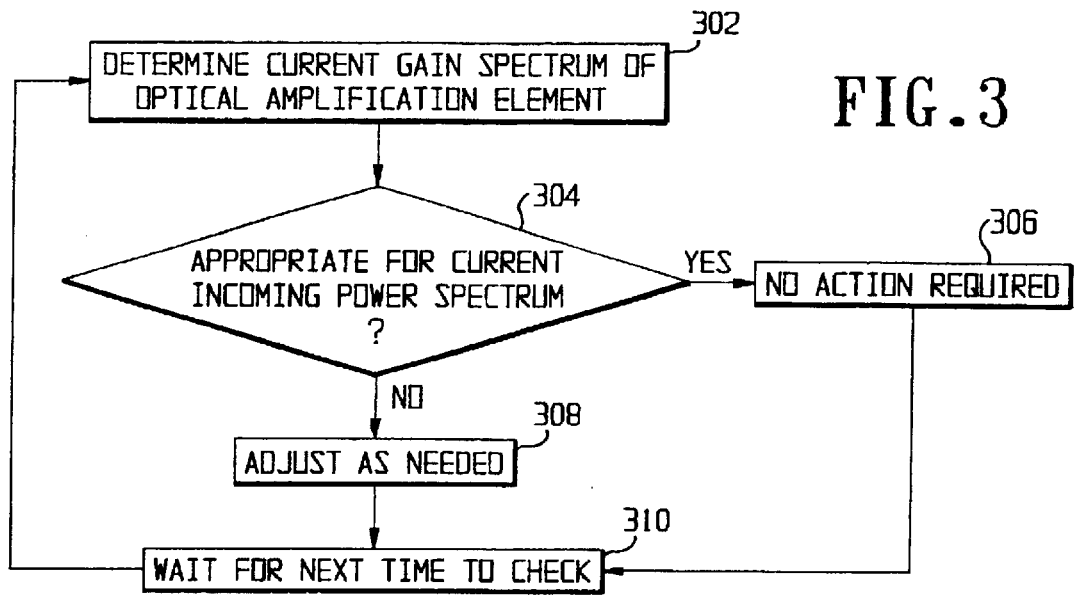
FIG. 3 shows a flow chart of the operation of the element of FIG. 2A.

The amplification element 200 can be used in any suitable situation, such as the iterative process shown in the flow chart of FIG. 3. In step 302, the current gain spectrum of the element 200 is determined. In step 304, it is determined whether that current gain spectrum is suitable for the current incoming power spectrum. If so, then it is determined in step 306 that no action is required. Otherwise, the appropriate adjustments are made in step 308, through controlling the currents $I_1$, $I_2$, $I_3$. In step 310, the process waits a predetermined time until the next time for which the gain spectrum of the element 200 must checked. After that predetermined time period, the process returns to step 302.

Figure 4:
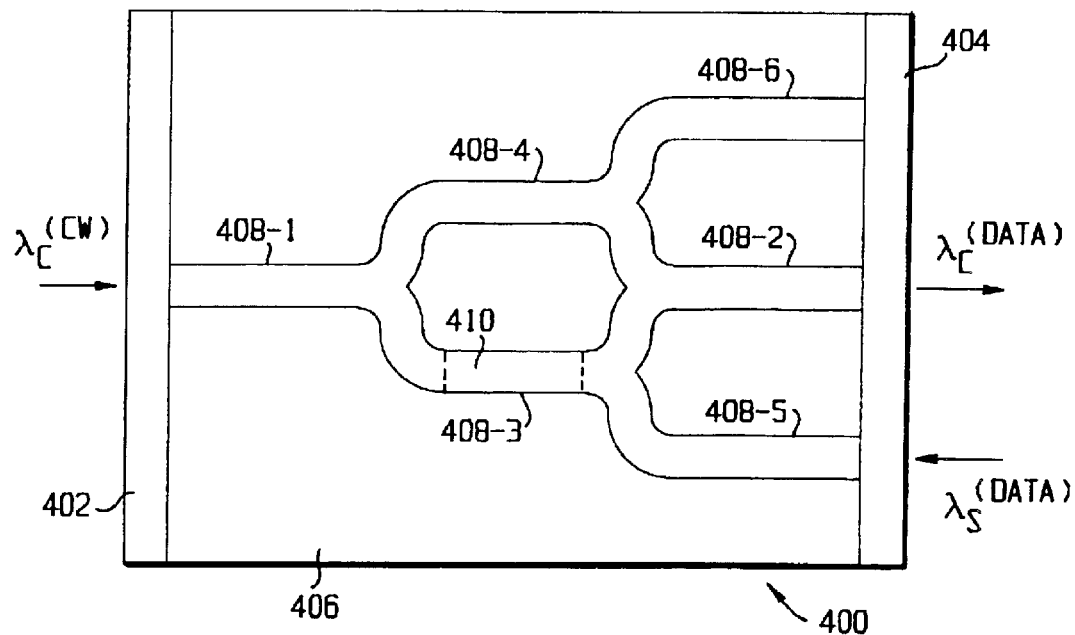
FIG. 4 shows a schematic diagram of a wavelength converter according to the second preferred embodiment.

Another preferred embodiment, applicable to wavelength conversion, will be disclosed with reference to FIG. 4. The second preferred embodiment is based on the wavelength converter of Idler et al, with the use of a spatially selective intermixing process as taught in the above-cited Thompson et al patent application to create regions of broadband cross-phase modulation in one arm of the interferometer. Such spatially selective intermixing allows the wavelength converter and the regions of broadband cross-phase modulation to be formed as a monolithic structure.

The wavelength conversion element 400 is a Mach-Zehnder interferometer having left and right facets 402 and 404 and a main body 406. In the main body 406 is monolithically formed a series of waveguides including gates 408-1 through 408-6, of which gate 408-6 is introduced for symmetry reasons. The carrier wave $\lambda_c^{(ew)}$ injected through gate 408-1 is modulated in gate 408-3 by the counter-running $\lambda_s^{(data)}$ to produce $\lambda_c^{(data)}$. As taught in Idler et al, currents are provided to the gates to control the operation of the conversion element 400.

In the element 400 of the second preferred embodiment, as opposed to that of Idler et al, the gate 408-3 includes a region 410 of broadband cross-phase modulation which functions as an amplifier. The region 410 is formed by any of the techniques taught in the above-cited Thompson et al patent application and can have a structure like that of one or more sections of the first preferred embodiment. The region 410 allows the element 400 to be dynamically reconfigurable, e.g., to handle different wavelengths as needed. Also, the process of FIG. 3 can be used with the element 400. Thus, if the carrier wave changes in wavelength over time or includes multiple wavelengths, the wavelength conversion element 400 can be adjusted dynamically to provide good results.

While two preferred embodiments of the present invention have been set forth above, those skilled in the art who have reviewed the present disclosure will readily appreciate that other embodiments can be realized within the scope of the present invention. For example, more or fewer regions can be provided as the number of wavelengths requires. Therefore, the present invention should be construed as limited only by the appended claims.

What is claimed is:

1. An optical amplification element for amplifying light, the optical amplification element comprising:
   a semiconductor quantum well structure having a quantum well active region whose effective bandgap properties are modified by rapid thermal annealing for controlled diffusion of defects into the quantum well active region such that the semiconductor quantum well structure functions as an optical amplifier with a gain spectrum; and
   an electrode for applying a current to the semiconductor quantum well structure to control the gain spectrum.

2. The optical amplification element of claim 1, comprising:
   a plurality of quantum well active regions in said semiconductor quantum well structure, each having a different gain spectrum; and
   a plurality of said electrodes, one for each of said plurality of said quantum well active regions.

3. The optical amplification element of claim 2, wherein the plurality of said quantum well active regions have different compositions.

4. The optical amplification element of claim 1, wherein the quantum well active region is an indium gallium arsenide phosphide (InGaAsP) quantum well active region.

5. A wavelength converter for modulating a first light beam having a first wavelength in accordance with data carried in a second light beam having a second wavelength to output a third light beam having the first wavelength and carrying the data, the wavelength converter comprising:
   an interferometer, having a gate, for receiving the first and second light beams and for causing the first and second light beams to interfere in the gate to modulate the first light beam in accordance with the data carried in the second light beam; and
   an optical amplifier disposed in the gate, the amplifier being controllable to vary a gain spectrum of the amplifier for different values of the first wavelength, the amplifier comprising:
   a semiconductor quantum well structure having a quantum well active region whose effective bandgap properties are modified by rapid thermal annealing for controlled diffusion of defects into the quantum well active region such that the semiconductor quantum well structure functions as the optical amplifier with the gain spectrum; and
   an electrode for applying a current to the semiconductor quantum well structure to control the gain spectrum.

6. The wavelength converter of claim 5, wherein the quantum well active region is an indium gallium arsenide phosphide (InGaAsP) quantum well active region.

7. A method of making an optical amplification element for amplifying light, the method comprising:

(a) forming, in a semiconductor quantum well structure, a quantum well active region;

(b) modifying effective bandgap properties in the quantum well active region by rapid thermal annealing for controlled diffusion of defects into the quantum well active region so that the effective bandgap properties cause the quantum well active region to function as an optical amplifier with a gain spectrum; and (c) providing an electrode in electrical communication with the quantum well active region.

8. The method of claim 7, wherein:

step (a) comprises providing a plurality of said quantum well active regions in said semiconductor quantum well structure;

step (b) comprises modifying the effective bandgap properties of each of the quantum well active regions such that the quantum well active regions have different gain spectra; and step (c) comprises providing a plurality of said electrodes, each in electrical communication with one of said plurality of quantum well active regions.

9. The method of claim 8, wherein step (b) comprises modifying the bandgap properties by spatially varying a spatial variation in a composition of the quantum well active region.

10. The method of claim 8, wherein step (b) comprises modifying the bandgap properties by spatially varying a thickness of the quantum well active region.

11. The method of claim 8, wherein the quantum well active region is an indium gallium arsenide phosphide (InGaAsP) quantum well active region.

12. The method of claim 11, wherein step (b) comprises:

(i) on top of the semiconductor quantum well structure, providing a first indium phosphide (InP) layer with vacancy type defects, wherein the vacancy type defects act as slow diffusers;

(ii) on top of the first InP layer, providing a second InP layer with interstitial type defects, wherein the interstitial type defects act as fast diffusers; and (iii) applying a rapid thermal annealing process to the semiconductor quantum well structure for controlled diffusion of the vacancy type defects and the interstitial type defects into the quantum well active region.

13. The method of claim 11, wherein step (b) comprises:

(i) on top of the semiconductor quantum well structure, providing an indium phosphide (InP) layer with point defects, wherein the point defects are donor-like phosphorus antisites or acceptor-like indium vacancies; and (ii) applying a rapid thermal annealing process for controlled diffusion of the point defects into the quantum well active region.

14. A method of amplifying light having at least one wavelength, the method comprising:

(a) passing the light through a semiconductor quantum well structure having a quantum well active region whose effective bandgap properties are modified by rapid thermal annealing for controlled diffusion of defects into the quantum well active region such that the semiconductor quantum well structure functions as an optical amplifier with a gain spectrum; and (b) applying a current to the semiconductor quantum well structure to control the gain spectrum.

15. The method of claim 14, wherein:

step (a) comprises passing the light through a plurality of said quantum well active regions in said semidconductor quantum well structure, each of said quantum well active regions having a different gain spectrum; and step (b) comprises applying a separate current to each of the semiconductor quantum well structures to control the gain spectrum of said each of the quantum well active regions, thereby achieving a total gain spectrum.

16. The method of claim 15, further comprising (c) making a determination of whether the total gain spectrum is adequate for an intensity spectrum of the light, and wherein step (b) comprises controlling values of the separate currents in accordance with the determination made in step (c) to control the total gain spectrum.

17. The method of claim 14, wherein the quantum well active region is an indium gallium arsenide phosphide (InGaAsP) quantum well active region.

18. A method of modulating a first light beam having a first wavelength in accordance with data carried in a second light beam having a second wavelength to output a third light beam having the first wavelength and carrying the data; the method comprising:

(a) providing an interferometer, having a gate, for receiving the first and second light beams and for causing the first and second light beams to interfere in the gate to modulate the first light beam in accordance with the data carried in the second light beam;

(b) providing an optical amplifier disposed in the gate, the amplifier being controllable to vary a gain spectrum of the amplifier for different values of the first wavelength, the amplifier comprising:

a semiconductor quantum well structure having a quantum well active region whose effective bandgap properties are modified by rapid thermal annealing for controlled diffusion of defects into the quantum well active region such that the semiconductor quantum well structure functions as the optical amplifier with the gain spectrum; and an electrode for applying a current to the semiconductor quantum well structure to control the gain spectrum; and (c) injecting the first and second light beams into the interferometer such that the first light beam is modulated in the gate in accordance with the data carried in the second light beam, and wherein the first light beam is amplified in the optical amplifier.

19. The method of claim 18, wherein the interferometer is a Mach-Zehnder interferometer.

20. The method of claim 18, further comprising (d) controlling the current in accordance with an intensity spectrum of the first light to provide broadband modulation of the first light.

21. The method of claim 18, wherein the quantum well active region is an indium gallium arsenide phosphide (InGaAsP) quantum well active region.

* * * * *